Feb. 18, 1964 C. A. RICHARD, JR 3,121,818

TRAVELING WAVE MIXER TUBE WITH HELIX PRODUCING
ITS OWN OSCILLATION FREQUENCY

Filed Nov. 19, 1959

INVENTOR.
CHARLES A. RICHARD, JR.
BY Percy P. Lantzy
ATTORNEY

United States Patent Office 3,121,818

Patented Feb. 18, 1964

3,121,818

TRAVELING WAVE MIXER TUBE WITH HELIX PRODUCING ITS OWN OSCILLATION FREQUENCY

Charles A. Richard, Jr., Pequannock, N.J., assignor to International Telephone and Telegraph Corporation, Nutley, N.J., a corporation of Maryland Filed Nov. 19, 1959, Ser. No. 854,198

9 Claims. (Cl. 315—3.6)

Figures 1, 2:
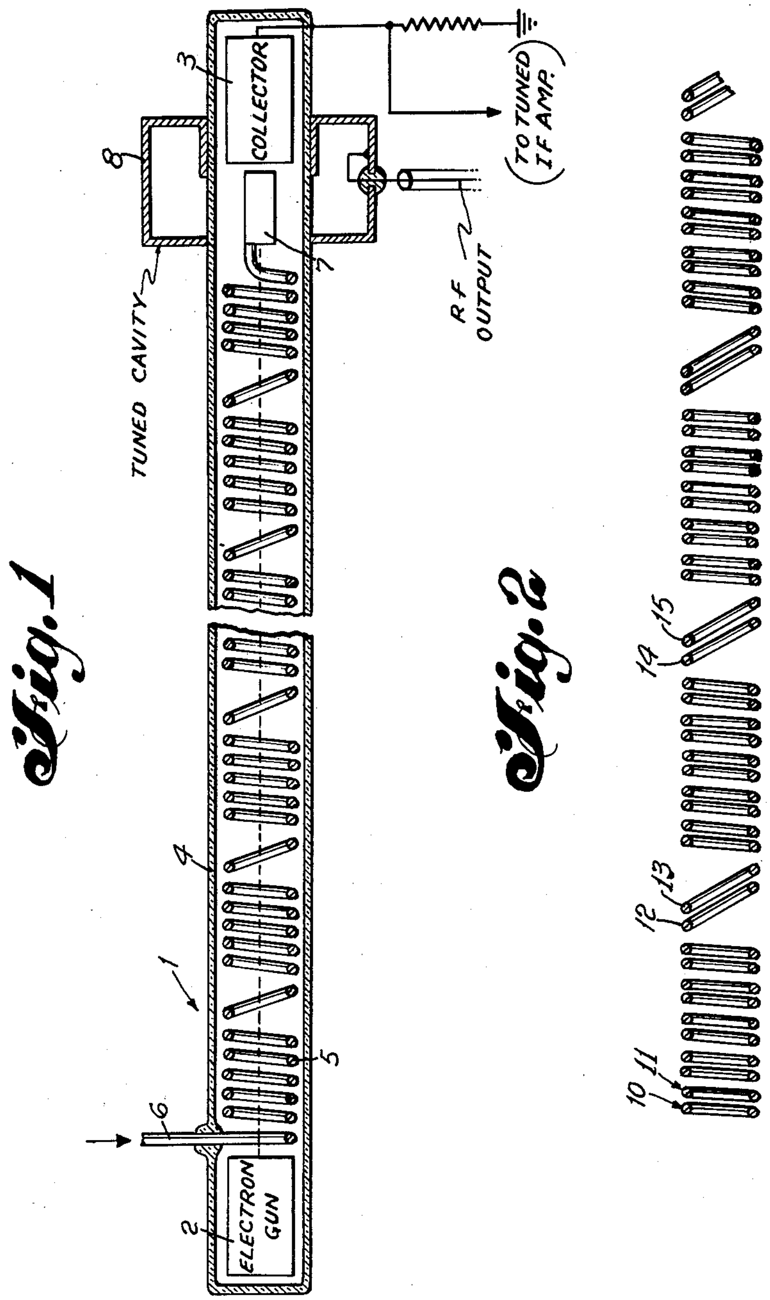

This invention relates to electron discharge devices of the traveling wave type and more particularly to slow wave structures therefor which enable such devices to be operated as signal mixers.

Traveling wave tubes which are capable of operation as mixers have recently attracted attention because they can provide wide intermediate frequency bandwidths at microwave frequencies. In addition, unlike crystal mixers, the traveling wave tube mixers are free from burnout due to high power input, and provide high level output power as well as isolation of the local oscillator from the input signal.

Traveling wave tube mixers generally utilize two helices to produce, for instance, the difference frequency between an input signal and a local oscillator. The first helix is usually operated for broad band amplification of the input and local oscillator signals and the second helix is operated at a higher voltage in the dispersive region and is tuned to the intermediate frequency, i.e., the difference between the local oscillator and input signals. This arrangement, of course, requires a separate signal and local oscillator source and the helices are arranged serially such that a rather lengthly device with its associated focusing problems results. Other arrangements utilize separate helices, wound in a bifilar manner, to propagate the input frequency and the local oscillator frequency to interact with an electron beam in the same region. Following this input helical arrangement is an output helix which is tuned to an intermediate frequency which may be either the sum or difference of the input and local oscillator frequencies. Still other prior art devices utilize backward wave amplification and backward wave oscillation and utilize space-harmonic slow wave structures which are relatively narrow pass band to provide an intermediate frequency output. The present invention, however, utilizes none of the above techniques but rather utilizes forward wave amplification of an externally applied signal mixed with an internally generated oscillation to provide an intermediate frequency output.

It is, therefore, an object of this invention to provide a traveling wave tube mixer which requires only a single input signal; the second wave oscillation signal being generated within the mixer tube itself.

A feature of this invention is the utilization in a traveling wave tube of a slow wave propagating structure having a plurality of periodic discontinuities disposed along the length thereof to cause in-phase reflections of one of the internally generated frequencies thereby causing the tube to oscillate at this one frequency. The periodic relationship of the discontinuities determines the frequency of oscillation.

Another feature is the utilization of a helical slow wave propagating structure having a plurality of turns of a given pitch interspersed with at least a single turn of pitch different from the main pitch to cause reflections which add in-phase thereby causing the tube to oscillate at a frequency different from the input frequency.

The above mentioned and other objects and features of this invention will become more apparent by reference to the following description of embodiments thereof taken in conjunction with the accompanying drawings in which:

FIG. 1 is a schematic representation of a traveling wave tube mixer having one form of slow wave structure made in accordance with the principles of this invention; and FIG. 2 is a schematic representation of a bifilarly wound helical slow wave structure which may be used to electrostatically focus an electron beam in an arrangement similar to FIG. 1.

Traveling wave tubes of the type to which the present invention is applicable comprise an electron gun which is disposed at one end of an elongated tubular envelope through which an electron beam is directed longitudinally of a slow wave structure. A collector element which is utilized to dissipate the electron beam is disposed at the other end of the elongated envelope and input and output terminals are disposed respectively, one adjacent the electron gun and the other adjacent the collector. The slow wave structure which is usually a helically wound wire of given pitch and diameter and of many turns to the inch is disposed between the input and output terminals and is utilized for the propagation of a radio frequency wave therealong. Since radio frequency energy in free space travels approximately at the speed of light, the helical configuration is utilized to propagate the radio frequency wave at substantially this speed. However, it may be seen that due to the helical configuration and further depending upon the diameter and pitch and the number of turns per inch of the helical element that the speed of propagation axially may be slowed down to some fraction of the speed of light. This permits the utilization of practical voltages and beam currents which must be provided to permit interaction of the radio frequency energy with the electron beam being transmitted axially therethrough. By properly synchronizing the velocity of the electron beam with the axial velocity of the radio frequency energy, interaction is caused to occur by which energy is converted from the beam to the radio frequency wave and it is by this means that amplification occurs.

The velocity of the electron beam is governed by the potential differences applied between the cathode and helix of a traveling wave tube. These potentials are so chosen that the electron velocities and the velocity of the waves propagating along the slow wave structure will be substantially equal throughout the band of frequencies for which the particular slow wave structure is designed. When the condition of substantial synchronism between the velocity of the electron beam and the radio frequency energy has been established, a bunching of the electrons occurs and because of this the amplitude of the traveling wave which has been initially introduced at an input terminal is amplified over its initial value, and an increase in the power delivered to the output occurs because energy has been transferred from the electron beam to the traveling wave by the interaction hereinabove described.

Thus, the operation of a traveling wave tube as an amplifier is exactly the same as has been described in the prior art with the exception that, when a special structure is provided, the conventional traveling wave amplifier of the prior art can be operated as a mixer. Referring now to FIG. 1, there is shown a schematic representation of a traveling wave tube 1 having an electron gun 2 and collector element 3 disposed at opposite ends of an elongated envelope 4. A slow wave structure 5 is shown disposed between electron gun 2 and collector 3, the structure 5 being terminated at one extremity adjacent the electron gun in an input terminal 6 to which a given frequency or given band of frequencies is applied. The usual solenoid employed to focus the electron beam axially of the slow wave structure is not shown. The helical structure 5 is terminated at the other extremity by a matching element 7 which matches the impedance of the helical line in a gradual manner to the impedance of an output cavity 8 or other coupling means which is coupled about envelope 4 adjacent the collector 3 and from which the intermediate frequency output signal is obtained.

The helical slow wave structure 5 consists of a plurality of turns of conductive wire made of molybdenum, for example, which is wound in a helical fashion such that, by way of example, there are 100 turns to the inch spaced .010 thousandths of an inch apart. The pitch and the diameter of the helix are in general governed by the frequency of operation and the velocity of the electron beam. The helix of FIG. 1, however, differs from prior art helices in that the winding is not uniform but has disposed therealong a plurality of periodically spaced discontinuities which are so disposed that a second frequency different from the input frequency will be generated internally of the tube. This second frequency is one or a very narrow band of the internally generated frequencies which is reflected in-phase by the periodic arrangement of discontinuities. Ultimately, then, the input frequency and this second frequency which is generated within the tube are mixed in the interaction between the beam and the electromagnetic field of the input signal flowing along the helix, and the sum and the difference of the frequencies may be obtained therefrom by utilizing output means tuned to a desired frequency such as the cavity 8 or an output connection to the collector 3. In FIG. 1, for example, discontinuities are introduced by changing the pitch of every fifth turn of the helix, and the successive fifth turns are spaced apart by a full wave length or a multiple thereof at the frequency at which oscillations are desired. The pitch of the particular turn itself may be varied, but this variation has no effect upon the frequency of oscillation but rather has an effect upon the amplitude of the oscillatory signal being generated.

In operation, the device of FIG. 1 as far as the amplification of the input signal frequency is concerned is as has been described hereinabove. With reference to the generation of the oscillatory frequency, however, it should be noted that this frequency wave has a forward component similar to that of the input wave. As in the operation of most oscillators, the frequency of oscillation which is determined by the spacial relationship of the discontinuities corresponds to a component frequency present as internal noise in the beam. This component of noise at the oscillation frequency encounters these discontinuities which because the discontinuities are spaced a full wave length apart for this component cause the reflections thereof to reinforce each other, and from one extremity of the helix to the other, a build-up of this oscillatory wave takes place. The helical slow wave structure should be constructed sufficiently long so that the oscillatory frequency can attain sufficient strength to modulate the electron beam. The modulation or bunching of the electron beam by the oscillatory signal occurs along with the modulation or bunching of the electron beam by the input signal. In this manner, then, components of frequency equal to the sum and the difference of the frequencies are present, and by the use of filters or other output means such as the cavity 8 of FIG. 1, any of the four frequency components may be obtained.

From the foregoing, then, it may be seen that the single helix having a plurality of discontinuities which are spaced a full wave length or a multiple thereof apart can provide a frequency output which may be either the sum or the difference of an input signal which has been introduced and a local oscillator frequency which has been generated internally of the traveling wave tube. This sum or difference of the frequencies may be at radio frequency, such as where the input is 10 mc. and the oscillation frequency is 15 mc. giving an output of either 25 mc. or 5 mc. depending upon the tuning of the output cavity 8. On the other hand, the mixing in the beam may be at intermediate frequencies where the input is 10,030 mc. and the oscillations at 10,000 or 10,060 giving an output of 30 mc. difference at a tuned output to the collector 3.

FIG. 2 shows a bifilarly wound helix which has periodically displaced discontinuities disposed along the length thereof. The bifilar helix includes two separate helices 10 and 11 of a given pitch except for periodic turns such as 12, 13 and 14, 15 which have a different pitch. This structure operates in a manner similar to the structure of FIG. 1 and further differs from the prior art in that only a single frequency or band of frequencies is coupled to the bifilar helix. The oscillatory frequency is generated internally of the tube by means of the periodic discontinuities which are disposed a wave length or a multiple thereof apart. A difference of potential is applied, however, between the helices, and it is by this means that an electric field is generated which electrostatically focuses the electron beam which must pass axially lengthwise of the bifilar helix. This structure of course eliminates the usual solenoid, such as required in FIG. 1, and an extremely light weight rugged traveling wave mixer is obtained.

While the slow wave structure has been shown as either a single helix or as a bifilar helix with periodically disposed discontinuities, it will be obvious to those skilled in the art that any other type of slow wave structure commonly used in traveling wave tubes may be employed and that the discontinuities may be formed by different structural arrangements so long as they provide in phase reflections of the desired internally generated frequency. For example, the slow wave structure may comprise a series of irises or a series of annular rings interconnected by spacer bars and the discontinuities may comprise a difference in the spacing or the presence of wave obstructions periodically disposed along the slow wave structure.

While I have described above the principle of my invention in connection with specific apparatus, it is to be clearly understood that this description is made only by way of example and not as a limitation to the scope of my invention as set forth in the objects thereof and in the accompanying claims.

I claim:

1. A traveling wave tube mixer comprising an input means for introducing into said mixer a given signal frequency, means in said mixer for propagating said input signal frequency therealong, means to project an electron beam in interacting relation with said input signal frequency, said electron beam generating other frequencies, means associated with said propagating means periodically disposed in a predetermined relationship to one of said other frequencies to produce in-phase reflections and cause said tube to oscillate said one frequency different from said input signal frequency, and output means coupled to said propagating means to remove the resulting signal frequencies therefrom.

2. A traveling wave tube mixer comprising an input means for introducing a given signal frequency into said mixer, a slow wave propagating structure in said mixer for propagating said input signal frequency therealong, means associated with said propagating means for producing periodic in-phase reflections to cause said tube to oscillate at a desired frequency different from said input signal frequency including a plurality of discontinuities periodically disposed along the length of said propagating means and having an effective periodicity equal to $n$ half wavelengths of the desired oscillatory frequency where $n$ is any even integer, and output means coupled to said propagating means to remove the resulting signal frequencies therefrom.

3. A traveling wave tube comprising means applying an external input signal frequency, means producing an electron beam which generates noise frequencies internally of said tube, and slow wave propagation means including a plurality of helical turns having a given pitch periodically interspersed along the length thereof in a predetermined relationship to one of said internal frequencies by at least a single turn of a pitch different from said given pitch to cause in-phase reflections therealong and oscillation of said one frequency different from said externally applied signal frequency.

4. A traveling wave tube comprising means applying an external input signal frequency, means producing an electron beam which generates frequencies internally of said tube, slow wave propagation means to cause in-phase reflections and oscillations of one of said internal frequencies different from said externally applied signal frequency including two helices disposed as a bifilar helix, the two helices being maintained at different potentials to focus an electron beam axially thereof, said helices having a given spacing periodically interspersed in a predetermined relationship to said one internal frequency by at least a pair of the turns thereof spaced differently from said other turn spacing along the length thereof.

5. A traveling wave tube mixer comprising an input means for introducing a given signal frequency into said mixer, a slow wave propagating structure in said mixer for propagating said input signal frequency therealong, electron beam forming means, said beam generating other frequencies, means forming a plurality of discontinuities spaced along the length of said structure in a predetermined periodic relationship to one of said other frequencies to cause in-phase reflections and oscillations at said one frequency different from said input signal frequency, and output means coupled to said propagating means to remove the resulting signal frequencies therefrom.

6. A mixer according to claim 5 wherein said discontinuities have an effective periodicity equal to an integral wavelength of said one frequency.

7. A mixer according to claim 5 wherein said output means includes a radio frequency cavity.

8. A mixer according to claim 5 wherein said output means includes a beam collector and an output connection coupled thereto.

9. A mixer according to claim 5, wherein said propagating means and said discontinuities include a helical slow wave structure having a given pitch and number of turns to the inch, and at least a single turn of said helical slow wave structure having a pitch different from said given pitch interposed in said periodic relationship between groups of turns having said given pitch.

References Cited in the file of this patent

UNITED STATES PATENTS

| | | |
|---|---|---|
| 2,820,172 | Field | Jan. 14, 1958 |
| 2,828,440 | Dodds et al. | Mar. 25, 1958 |
| 2,843,733 | Harrison | July 15, 1958 |
| 2,916,658 | Currie | Dec. 8, 1959 |